US006268633B1

(12) United States Patent
Pio et al.

(10) Patent No.: US 6,268,633 B1
(45) Date of Patent: Jul. 31, 2001

(54) ELECTRONIC STRUCTURE COMPRISING HIGH AND LOW VOLTAGE TRANSISTORS, AND A CORRESPONDING FABRICATION METHOD

(75) Inventors: Federico Pio, Brugherio (IT); Olivier Pizzuto, Fuveau (FR)

(73) Assignees: STMicroelectronics S.r.l., Agrate Brianza (IT); STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/222,568

(22) Filed: Dec. 28, 1998

(30) Foreign Application Priority Data

Dec. 31, 1997 (FR) .................................................. 97 16882

(51) Int. Cl.⁷ .................................................. H01L 29/76
(52) U.S. Cl. ........................ 257/391; 257/501; 257/413; 257/384
(58) Field of Search .................................. 257/500, 501, 257/413, 384, 754, 755, 757; 438/201, 592, 603, 649, 655, 663, 664

(56) References Cited

U.S. PATENT DOCUMENTS

| 4,717,684 | * | 1/1988 | Katto et al. ............................. 437/34 |
| 4,814,854 | | 3/1989 | Tigelaar et al. ........................ 357/67 |
| 5,024,960 | * | 6/1991 | Haken ..................................... 437/34 |
| 5,472,887 | | 12/1995 | Hutter et al. ............................ 437/34 |
| 5,589,423 | | 12/1996 | White et al. ........................... 437/228 |
| 5,605,853 | | 2/1997 | Yoo et al. ............................... 437/43 |
| 5,783,850 | * | 7/1998 | Liau et al. ............................. 257/413 |
| 5,850,096 | * | 12/1998 | Izawa et al. ........................... 257/377 |
| 5,883,418 | * | 3/1999 | Kimura .................................. 257/413 |

FOREIGN PATENT DOCUMENTS 0 811 983 A1   12/1997 (EP) .
09283643       10/1997 (JP) .

* cited by examiner

Primary Examiner—Olik Chaudhuri
Assistant Examiner—Nathan W. Ha
(74) Attorney, Agent, or Firm—Theodore E. Galanthay; Robert Iannucci; Seed IP Law Group PLLC

(57) ABSTRACT

A structure of electronic devices integrated in a semiconductor substrate with a first type of conductivity comprising at least a first HV transistor and at least a second LV transistor, each having a corresponding gate region. Said first HV transistor has lightly doped drain and source regions with a second type of conductivity, and said second LV transistor has respective drain and source regions with the second type of conductivity, each including a lightly doped portion adjacent to the respective gate region and a second portion which is more heavily doped and comprises a silicide layer.

17 Claims, 8 Drawing Sheets

ELECTRONIC STRUCTURE COMPRISING HIGH AND LOW VOLTAGE TRANSISTORS, AND A CORRESPONDING FABRICATION METHOD

TECHNICAL FIELD

This invention relates to a structure comprising an HV (High Voltage) transistor and an LV (Low Voltage) transistor, as well as to a corresponding manufacturing method, especially in processes wherein a silicide is used.

The invention relates, in particular but not exclusively, to a structure to be integrated into a substrate along with devices which are operated at a high voltage, such as non-volatile memories of the EEPROM and FLASH-EEPROM types.

BACKGROUND OF THE INVENTION

As is well known, current technologies for making semiconductor integrated circuits have enabled the resistance of the interconnections and contact areas in the active areas of the individual devices to be significantly reduced through the use of composite materials comprising silicon and a transition metal such as titanium or tungsten. These composite materials are called silicides, and are used for producing layers with relatively low resistivities.

The formation of a silicide layer over the active areas of MOS transistors comprises the following steps, once the transistor gate has been formed:

implanting first portions of the source and drain regions with dopant at a low concentration;

forming spacer elements adjacent to the gate and the interconnection lines;

implanting second portions, included in the source and drain regions of the transistor, at a high concentration;

depositing a transition metal over the entire surface of the substrate;

carrying out a thermal process wherein the transition metal will react selectively with the substrate surface to yield the silicide.

These process steps result in the silicide layer being also deposited over the polysilicon which forms the gates and interconnections of the transistor, since the etching steps for clearing the active areas of the oxide which is covering them have a similar effect on interconnections provided by polysilicon lines.

These silicide layers cannot be utilized in the manufacturing of high voltage devices, specifically of HV (High Voltage) transistors either of the P-channel or N-channel type, formed using the DE (Drain Extension) technique. In these devices, the source and drain diffusions are provided as lightly doped regions to obtain HV transistors whose breakdown voltage is set sufficiently high to withstand high bias and working voltages.

It is indeed in these regions that, due to their low dopant concentration and relatively small thickness, the process for making silicide layers may develop problems. For example, in carrying out the thermal process for reacting the transition metal layer with the substrate surface, some of the dopant in the substrate is taken up by the silicide layer at the expense of a substrate surface layer, so that in normal operation the silicide will become shorted to the substrate.

SUMMARY OF THE INVENTION

An embodiment of this invention provides a structure of electronic devices comprising high and low voltage transistors, which has such structural features as to allow the high voltage transistors to handle high voltages, while reducing the contact resistances, improving the speed of response of the low voltage transistors, and overcoming the limitations of prior art structures.

The structure of electronic devices is integrated in a semiconductor substrate with a first type of conductivity and includes at least an HV transistor and at least an LV transistor, each having a corresponding gate region. The HV transistor has lightly doped drain and source regions with a second type of conductivity, and the LV transistor has respective drain and source regions with the second type of conductivity, each including a lightly doped portion adjacent to the respective gate region and a second portion which is more heavily doped. The LV transistor has its source and drain regions formed with low resistivity layers.

Another embodiment of the invention is directed to a process for making an integrated structure in a semiconductor substrate comprising at least an HV transistor and at least an LV transistor, each having a corresponding gate region. The process provides: a first implantation of a first type of dopant at a low concentration for forming drain and source regions of the HV transistor and first portions of drain and source regions of the LV transistor; the formation of an oxide layer over an active area of the HV transistor; and a second implantation of the first type of dopant at a higher concentration than in the first implant to form second portions of the source and drain regions of the LV transistor. The process also includes forming a metal layer over a surface of the substrate, followed by thermally treating the metal layer to selectively form a silicide layer over the second portions of the LV transistor The features and advantages of a structure according to the invention will be apparent from the following description of an embodiment thereof, given by way of example and not of limitation with reference to the accompanying drawings.

DETAILED DESCRIPTION OF THE INVENTION

Referring to the drawing views, generally shown at 50 is a structure of electronic devices integrated, according to the invention, in a semiconductor substrate 1. The structure 50 comprises at least one first HV (High Voltage) transistor 2 and at least one second LV (Low Voltage) transistor 3.

The description which follows will make reference to a preferred embodiment with devices of the N type. Where devices of the P type are involved, the conductivity types mentioned should be reversed.

Figure 1:
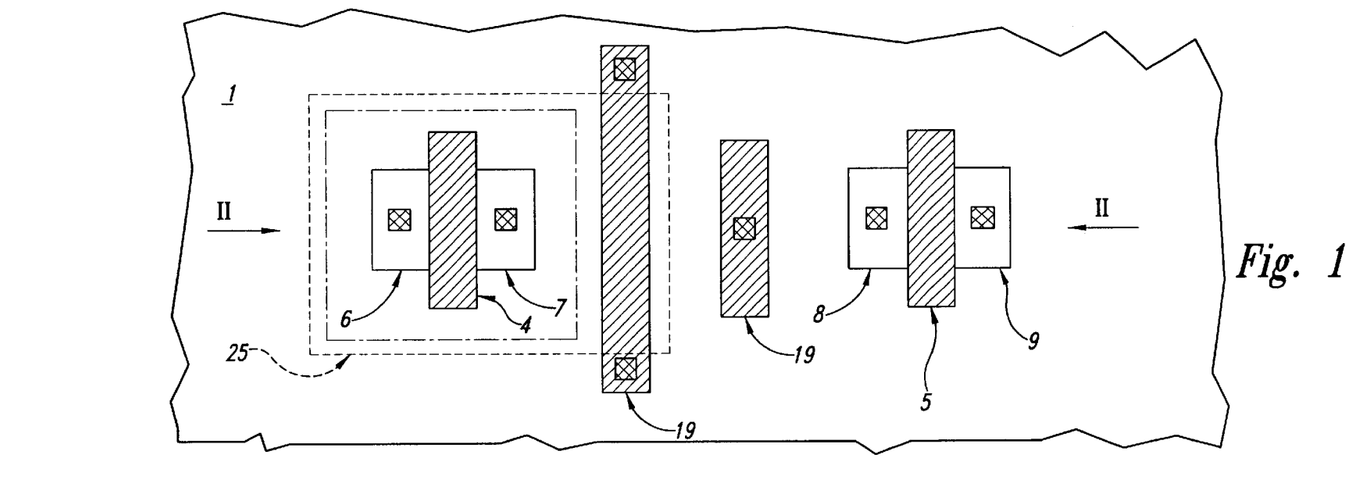
FIG. 1 is a plan view of a structure according to this invention.
Figure 2:
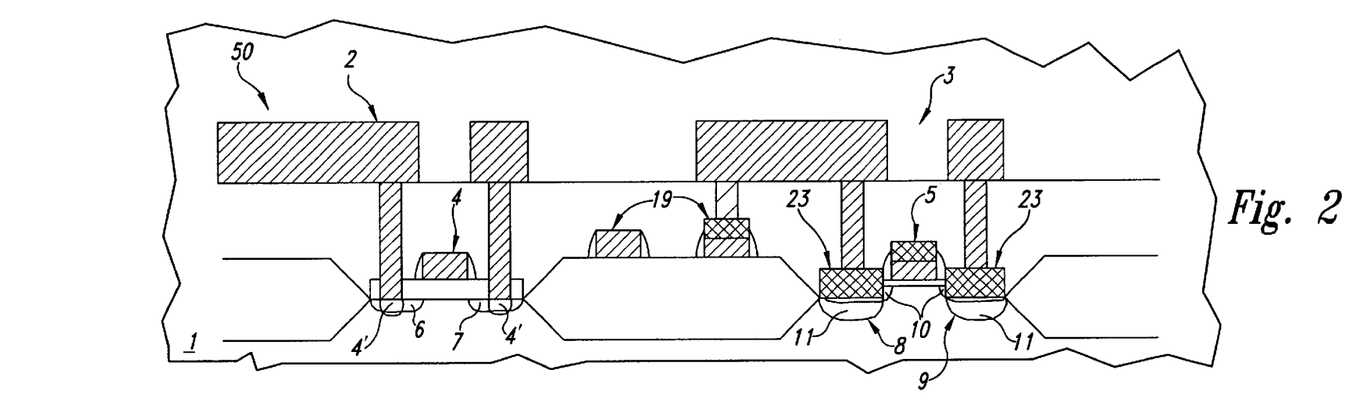
FIG. 2 is a sectional view of the structure in FIG. 1, taken along line II—II.

The HV transistor 2 has a drain region 6 and a source region 7. The drain region 6 is formed by a first implantation of the N− type in the substrate 1 of the P type. The source region is formed by an implantation of the N+ type. Advantageously, the source region 7 is also formed by the first implantation of the N− type. These regions 6, 7 are separated by a channel region overlaid by a gate region 4 which comprises a polysilicon layer 18 isolated from the substrate 1 by an oxide layer 15a having a first thickness.

The LV transistor 3 comprises respective drain 8 and source 9 regions, each having a first portion 10 formed by the first implantation of the N− type in the substrate 1 and a second portion 11 formed by a second implantation of the N+ type so as not to have the second portion 11 aligned to the gate 5.

This gate region 5 comprises a polysilicon layer 18 isolated from the substrate 1 by another oxide layer 17, thinner than the oxide layer 15a. The gate region 5 additionally comprises a silicide layer 23.

This silicide layer 23 also covers the second portions of the drain 8 and source 9 regions.

Advantageously, spacer elements 5a of a dielectric material are provided on either sides of the respective gates 4 and 5 of the first and second transistors.

Advantageously, the source 6 and drain 7 regions include contact regions 4' which are more heavily doped than their respective source 6 and drain 7 regions.

Advantageously, the gate 4 and contact 4' regions of the HV transistor 2 also include a silicide layer 23.

Figure 3:
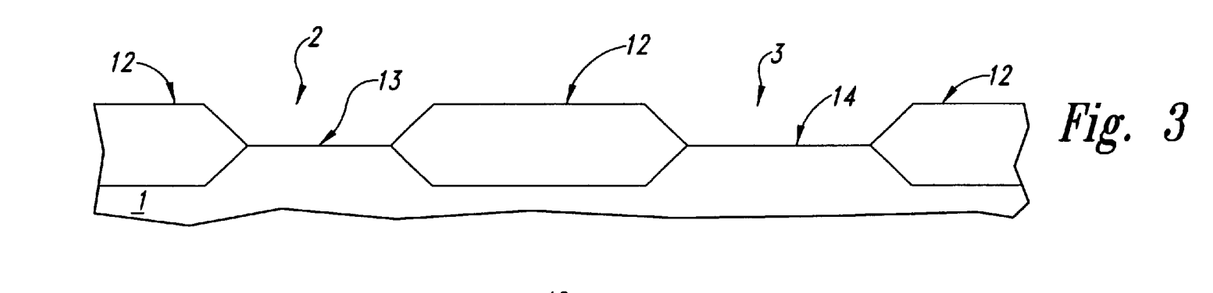
FIGS. 3 to 14 illustrate process steps for making the structure of FIG. 1.

Referring to FIGS. 3 to 14, a process according to a first embodiment of this invention for making the structure described above comprises the step of selectively forming, over the surface of the substrate 1, a first layer 12 of field oxide having a first thickness to define respective first 13 and second 14 active areas of the first 2 and second 3 transistors (FIG. 3).

Figure 4:
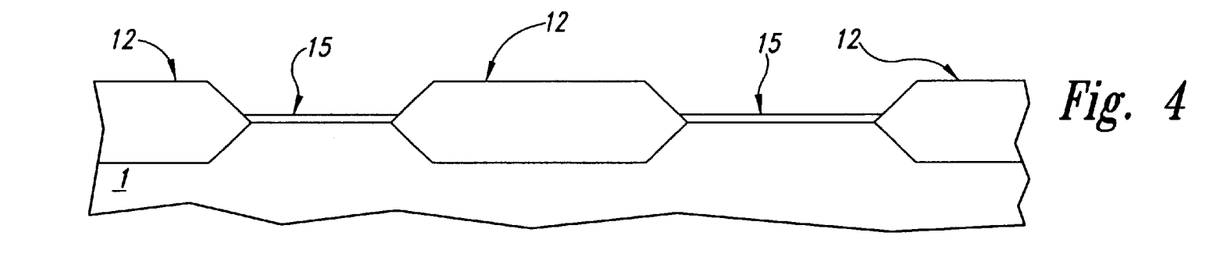

Formed in these active areas 13, 14 is a second oxide layer 15 having a second thickness which is much smaller than the thickness of the first oxide layer 12 (FIG. 4).

Figure 5:
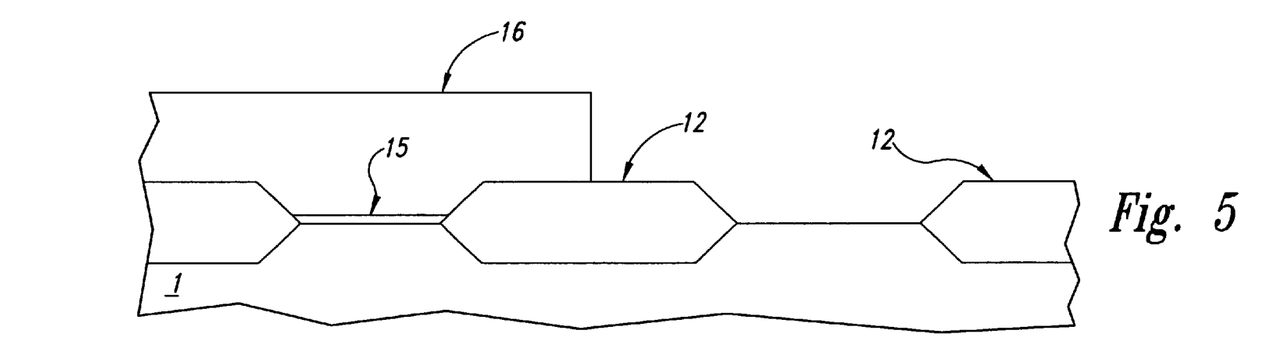

This layer 15 is then removed selectively from the active region 14 by a photolithographic process using a first mask 16 (FIG. 5).

Figure 6:
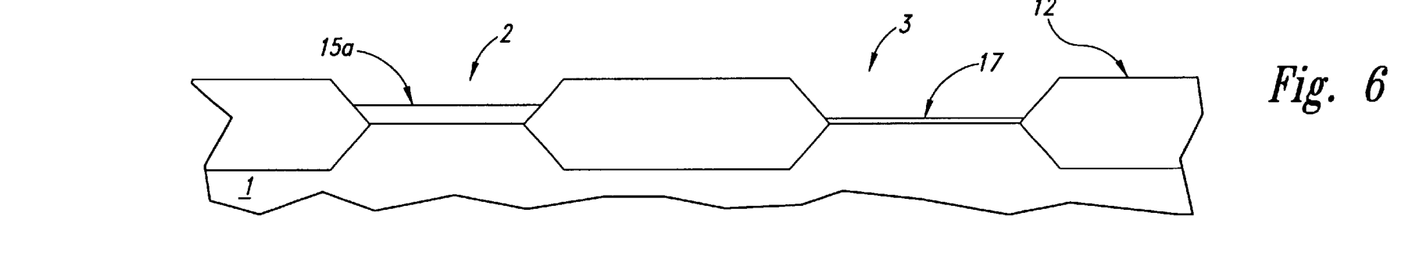

A third oxide layer 17, thinner than the second layer 15, is then formed over the entire surface of the substrate 1. In this way, the active area 13 will be formed with an oxide layer 15a, thicker than the layer 17, to provide the gate oxide of the first HV transistor 2 (FIG. 6).

Figure 7:
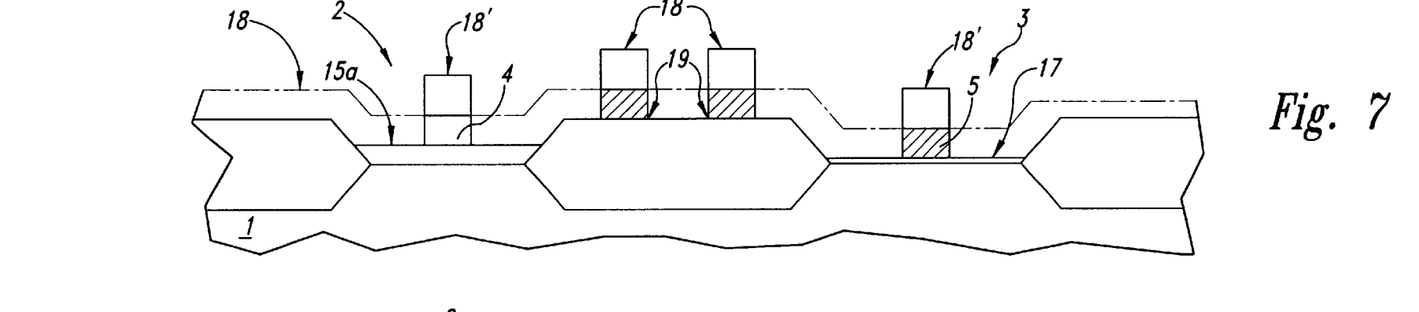

Thereafter, a polysilicon layer 18 is deposited which is then removed selectively by a photolithographic process providing for the use of a second mask 18', in order to form the respective gate regions 4, 5 of the first and second transistors 2, 3, and interconnection lines 19 (FIG. 7).

Figure 8:
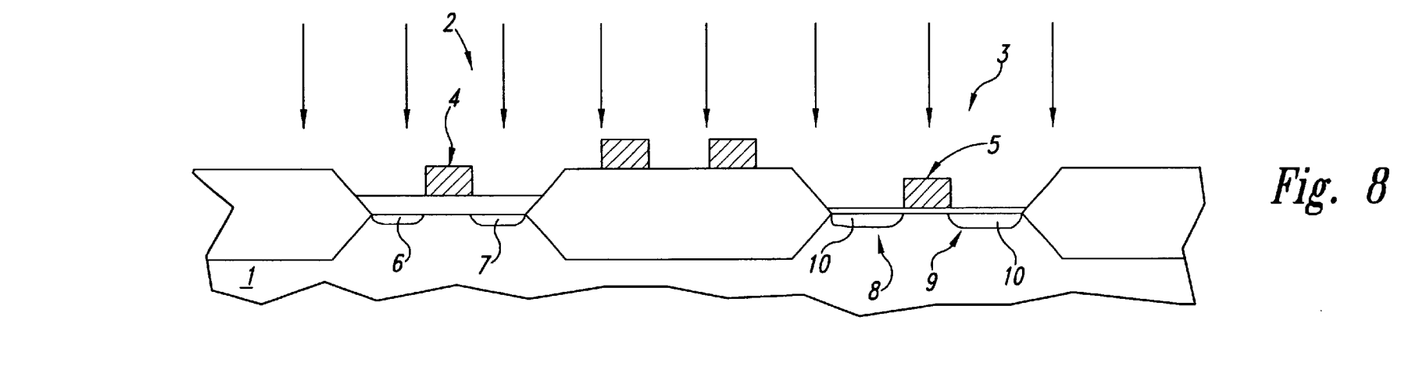

The first implantation, of the N− type, is then effected to form the drain 6 and source 7 regions of the first HV transistor 2 and the first portions 10 of the drain 8 and source 9 regions of the second LV transistor 3 (FIG. 8).

Figure 9:
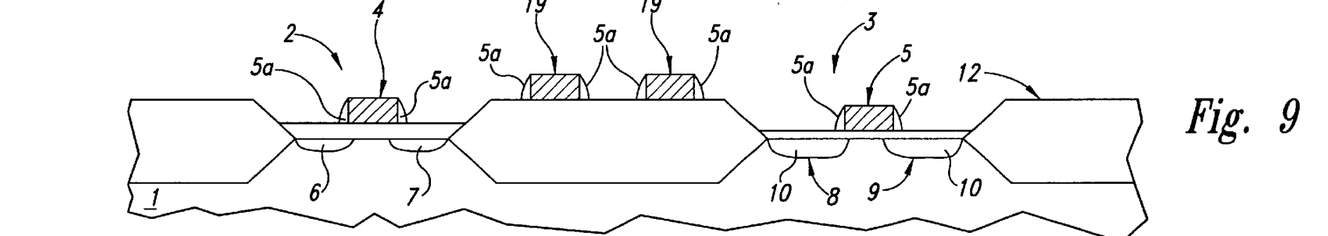
Figure 10:
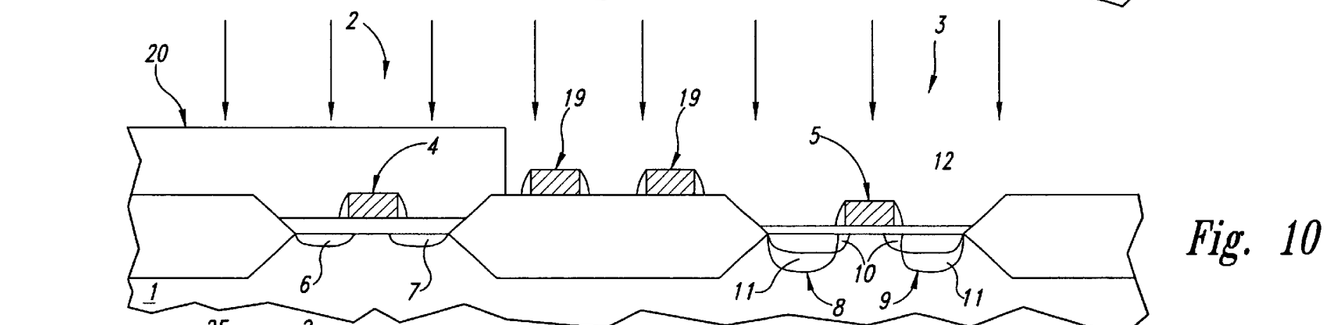

Using conventional techniques, the spacers 5a of dielectric material are then formed on either sides of the respective gates 4, 5 of the first 2 and second 3 transistors, and on the interconnection lines 19, as shown in FIG. 9.

This is followed by the formation of a layer 20 of a light-sensitive resin, which is removed selectively from the active area 14 of the second LV transistor 3 to form a third mask effective to screen off the active area 13 of the first HV transistor 2.

Advantageously, this light-sensitive resin layer 20 may be removed from the areas where the contact regions 4' of the HV transistor 2 are to be formed.

Subsequently, a second implantation, of the N+ type, is effected to form the second portions 11 of the source 9 and drain 8 regions of the second LV transistor 3 (FIG. 10), and optionally the contact regions 4'.

Figure 11:
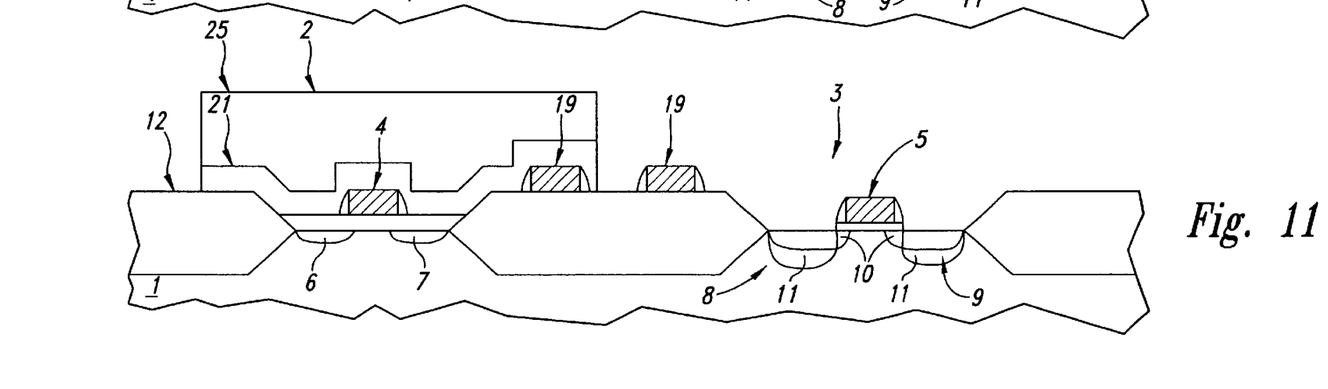

The process further provides for the formation of a fourth dielectric layer 21 over the whole surface of the substrate 1 (FIG. 11).

This layer 21 is then removed selectively from the active area 14 of the second LV transistor 3 by a photolithographic process using a fourth mask 25 (silicide protect).

Advantageously, the dielectric layer 21 is also removed from the contact 4' and gate 4 regions of the HV transistor 2.

Figure 12:
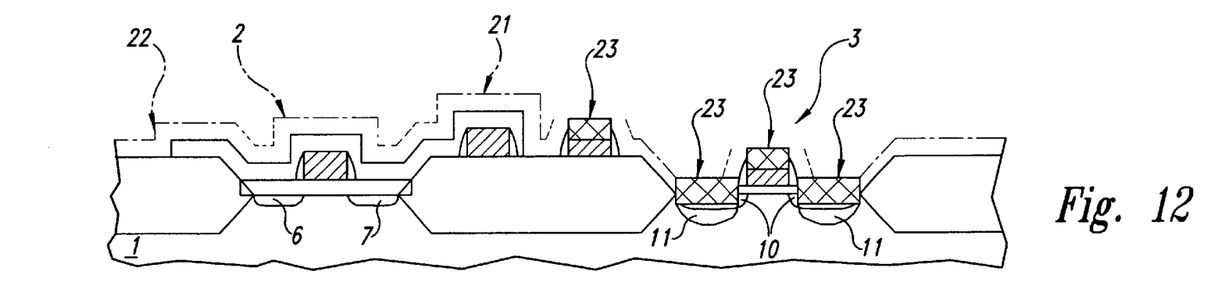
Figure 13:
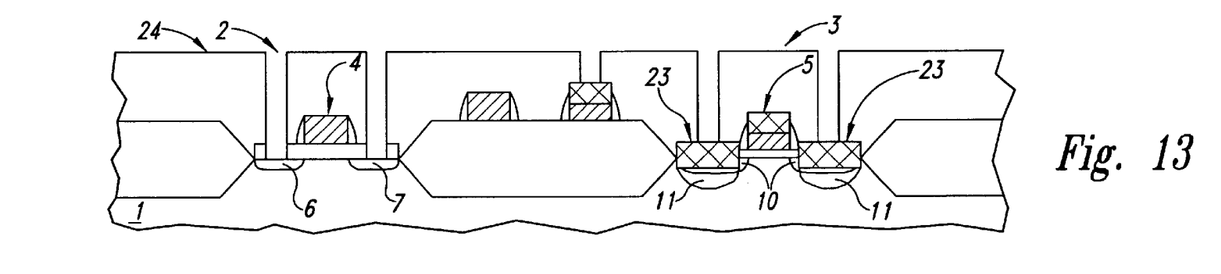

A metal layer 22 is next formed over the whole silicon surface, and a thermal treatment is applied for reacting the metal layer 22 with the surface of the substrate 1 and producing a silicide layer 23 (FIG. 12).

During the thermal treatment, the transition metal 22 will only react with the portion of the substrate 1 where no dielectric layer 21 is present. The gate region 5 and second portions of the drain 8 and source 9 regions of the LV transistor 3, and optionally the gate 4 and contact 4' regions of the HV transistor 2, are then covered with a layer having relatively low resistance.

A fifth layer 24 of intermediate oxide is formed and then removed selectively to define the areas where the contact areas in the drain regions 6, 8 and source regions 7, 9 of the first and second transistors 2, 3, and in the interconnection lines 19 (FIG. 13), are to be formed.

Figure 14:
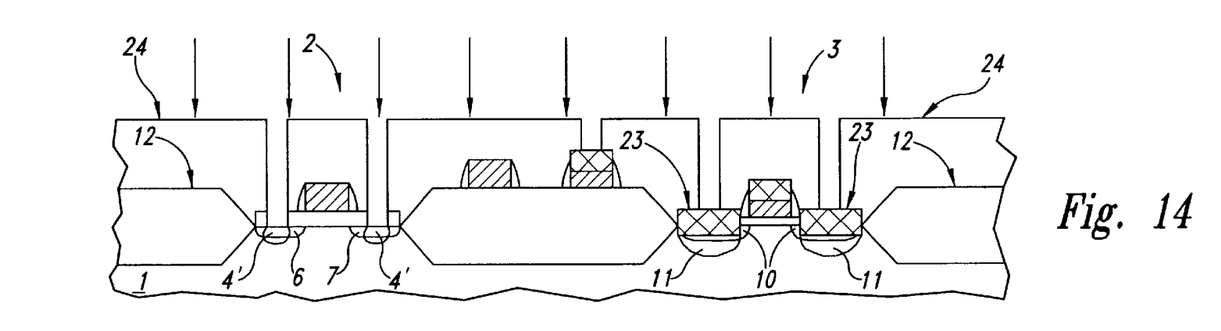

If no contact regions 4' have been provided, a third N+ implantation is effected for this purpose (FIG. 14).

The structure is then completed by conventional process steps.

As said before, the foregoing description covers the making of an inventive structure comprising N-channel HV and LV transistors. In conventional CMOS processes, a second portion, comprising transistors of the P type integrated in a buried region 1' of the N type implanted in the substrate 1 of the P type, is associated with a first portion of N-channel devices.

The process according to the first embodiment of this invention for forming, in the same substrate, the structure portion relating to N-channel HV and LV transistors 2, 3, and to P-channel HV and LV transistors 2', 3', is implemented by adding conventional process steps for CMOS structures to those described above.

Modifications are possible, on the other hand, for defining the contact areas and implanting contact regions in the structure comprising HV 2 and LV 3 transistors of the N type, and HV 2' and LV 3' transistors of the P type, the last-mentioned transistors having respective second source and drain regions 11' of the P+ type which comprise a silicide layer 23.

Figure 15:
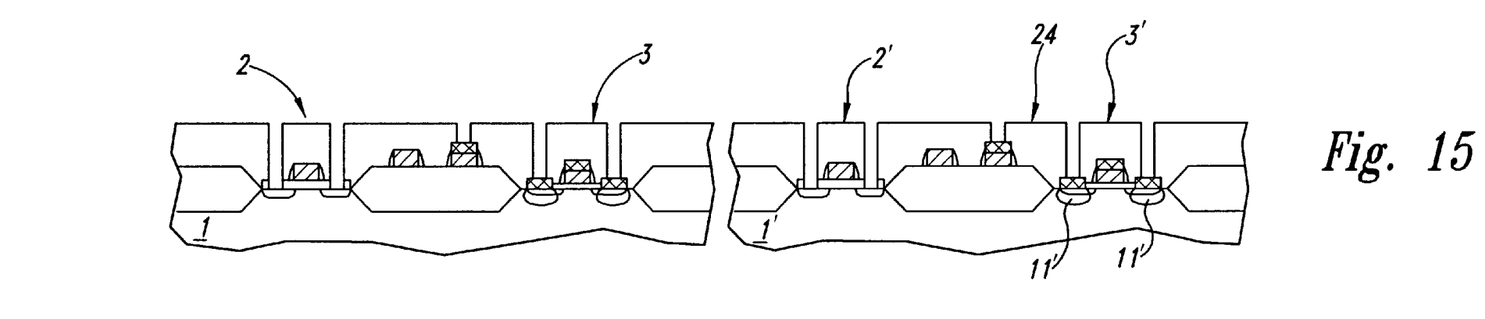
FIGS. 15 to 17 illustrate steps of a first embodiment of a process for making contact regions of a structure according to the invention comprising devices of the N and P types.

A first embodiment provides, following the deposition of the intermediate oxide layer 24, for its selective removal by a photolithographic process using a fifth mask to define the contact areas (FIG. 15).

Figure 16:
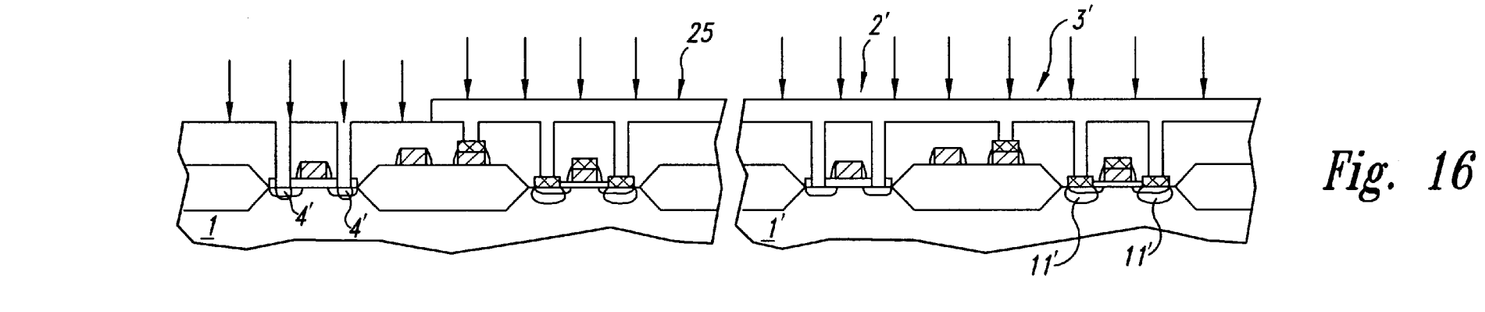

A layer 25 of a light-sensitive resin is then formed, which is removed selectively by a photolithographic process using a sixth mask to define the area containing the N-channel HV transistor 2. An implantation of the N+ type is then effected to produce contact regions 4' of the HV transistor 2, of the N type (FIG. 16).

Figure 17:
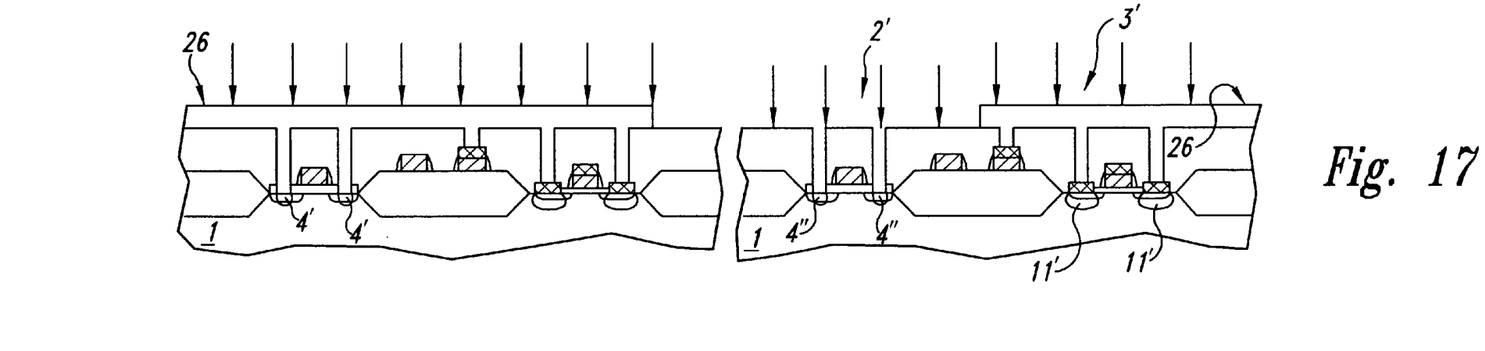

Another layer 26 of a light-sensitive resin is formed and then removed selectively by a photolithographic process using a seventh mask to define the structure portion which comprises P-channel HV transistor 2', followed by an implantation of the P+ type to form the contact regions 4" of the HV transistor 2' of the P type (FIG. 17).

This embodiment has an advantage in that it has a single critical mask, the fifth, for exposing the contact areas in the source and drain regions and on the interconnections. Furthermore, this particular process sequence avoids the implanting of dopant in the silicide layer which would increase its resistance disadvantageously.

Figure 18:
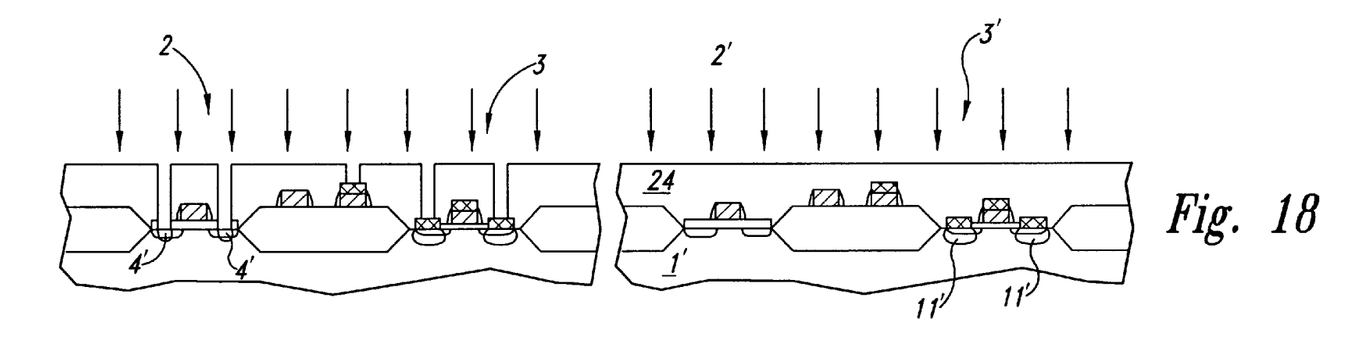
FIGS. 18 and 19 illustrate steps of a second embodiment of a process for making contact regions of a structure according to the invention comprising devices of the N and P types.

A second embodiment provides for the intermediate layer 24 to be removed selectively after its deposition by a photolithographic process using an eighth mask to define the contact areas of the HV and LV transistors 2 and 3 in the N-type structure, followed by an N+ implantation to form the contact regions 4' in this first portion (FIG. 18).

Figure 19:
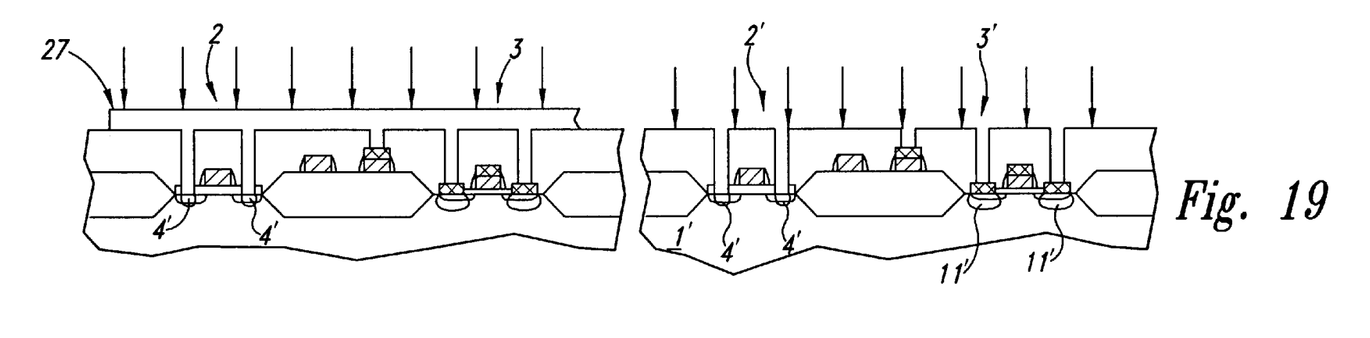

A layer 27 of a light-sensitive resin is formed and then removed selectively by a photolithographic process using a ninth mask to define the contact areas of the P-channel HV and LV transistors 2' and 3'. This is followed by a P+ implantation (FIG. 19) to form the contact regions 4" in these transistors 2'.

Advantageously, this process embodiment requires fewer masks.

Figure 20:
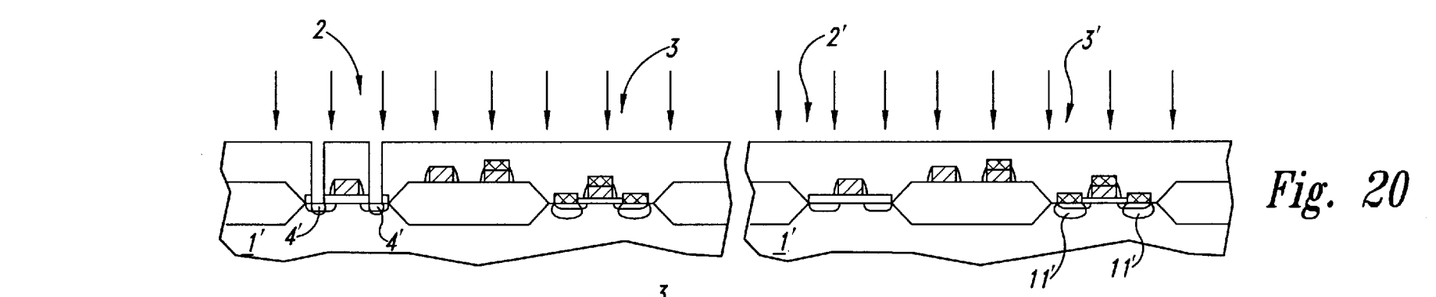
FIGS. 20 to 22 illustrate steps of a third embodiment of a process for making contact regions of a structure according to the invention comprising devices of the N and P types.

A further embodiment for defining the contact regions provides for a selective removal, by a photolithographic process using a tenth mask, of the intermediate oxide layer 24 to define the contact areas of the HV transistor 2 in the N type of structure portion. An implantation of the N+ type is then effected to produce the contact regions 4' of HV transistor 2 of the N type (FIG. 20).

Figure 21:
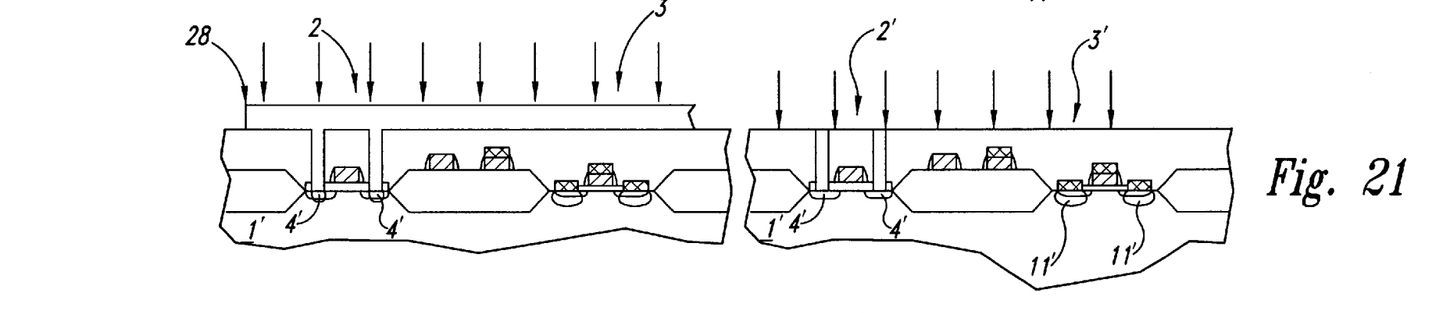

A light-sensitive resin layer 28 is then formed, and selectively removed by a photolithographic process using an eleventh mask to define the contact areas of P-channel HV transistor 2', and an implantation of the P+ type (FIG. 21) is subsequently effected to form the contact regions 4" of the HV transistor 2' of the P type.

Figure 22:
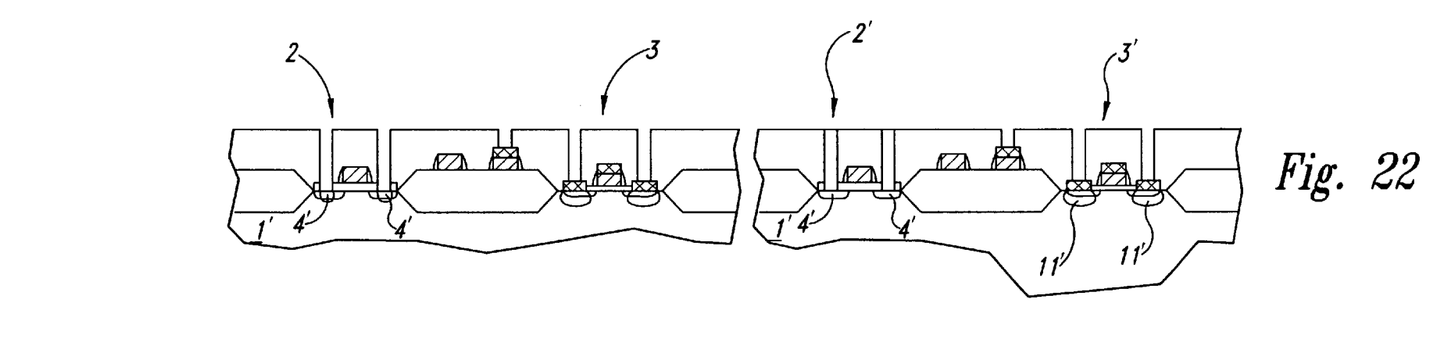

The contact areas of both the N-channel and P-channel LV transistors, 3 and 3' (FIG. 22), are then defined by a photolithographic process using a twelfth mask.

In this embodiment, therefore, a more selective etching process may be used to form the contact areas, by separate application to the silicon and the silicide layer.

Accordingly, this embodiment will also make the ion implantation into the silicide layer unnecessary which leads to an increase in the surface resistance of that layer.

In summary, the structure of this invention allows both transistors formed for high voltage operation and transistors with good speed characteristics to be integrated in the same substrate with fewer process steps.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A structure of electronic devices integrated in a semiconductor substrate having a first type of conductivity, the structure comprising a high voltage transistor and a low voltage transistor, each having a corresponding gate region, wherein said high voltage transistor has a drain region lightly doped with a second type of conductivity, and said low voltage transistor has respective drain and source regions with the second type of conductivity, each including a lightly doped portion adjacent to the gate region of said low voltage transistor and a second portion which is more heavily doped, wherein said second portion comprises a silicide layer and the high voltage transistor includes a source region and first and second spacers positioned on opposite sides of the gate region, the drain and source regions of the high voltage transistor each comprising a contact region that is laterally spaced from the first and second spacers and is more heavily doped than a remainder of said drain and source regions of the high voltage transistor.

2. A structure according to claim 1 wherein said gate region of the low voltage transistor comprises a silicide layer.

3. A structure according to claim 1 wherein said gate region of the high voltage transistor comprises a silicide layer.

4. A structure according to claim 1 wherein said contact regions of the high voltage transistor comprise a silicide layer.

5. A structure according to claim 1 wherein the gate region of the high voltage transistor includes an oxide layer that is thicker than an oxide layer of the gate region of the low voltage transistor.

6. An electronic memory device integrated in the semiconductor substrate and comprising the structure recited in claim 1.

7. A process for making in a semiconductor substrate an integrated structure that includes a first high voltage transistor and a first low voltage transistor, each having a corresponding gate region, the process comprising:
   implanting a first type of dopant at a low concentration for forming drain and source regions of the first high voltage transistor and first portions of drain and source regions of the first low voltage transistor;
   implanting the first type of dopant at a higher concentration that in the first implanting act to form second portions of the source and drain regions of the first low voltage transistor;
   forming a metal layer over a surface of the substrate, followed by thermally treating the metal layer to selectively form a silicide layer over the second portions of the first low voltage transistor; and
   forming contact regions of the first high voltage transistor by selectively implanting into the source and drain regions of the first high voltage transistor the first type of dopant at a higher concentration that the low concentration, with the first low voltage transistor being screened off while the contact regions are formed.

8. A process according to claim 7 wherein the act of selectively forming said silicide layer includes extending said silicide layer over the gate region of the first high voltage transistor.

9. A process according to claim 7, further comprising extending said silicide layer over the contact regions of the first high voltage transistor.

10. A process for making a semiconductor substrate an integrated structure that includes a first high voltage transistor and a first low voltage transistor, each having a corresponding gate region, the process comprising:

implanting a first type of dopant at a low concentration for forming drain and source regions of the first high voltage transistor and first portions of drain and source regions of the first low voltage transistor;

implanting the first type of dopant at a higher concentration than in the first implanting act to form second portions of the source and drain regions of the first low voltage transistor;

forming a metal layer over a surface of the substrate, followed by thermally treating the metal layer to selectively form a silicide layer over the second portions of the first low voltage transistor;

forming a second high voltage transistor and a second low voltage transistor in the semiconductor substrate;

forming a silicide layer on regions of said second low voltage transistor;

forming contact regions of the first high voltage transistor by selective implantation of the first type of dopant into the source and drain regions of said first high voltage transistor, with the first and second low voltage transistors and the second high voltage transistor being screened off; and forming contact regions of the second high voltage transistor by selective implantation of the second type of dopant into source and drain regions of said second high voltage transistor, with the low voltage transistors and the first high voltage transistor being screened off.

11. A process according to claim 10 wherein the contact areas of the high voltage transistors are formed by selectively etching a surface of the substrate.

12. A process according to claim 10, further including forming contact areas of the low voltage transistors by selectively etching the silicide layer.

13. A process for making in a semiconductor substrate an integrated structure that includes a first high voltage transistor and a first low voltage transistor, each having a corresponding gate region, the process comprising:

implanting a first type of dopant at a low concentration for forming drain and source regions of the first high voltage transistor and first portions of drain and source regions of the first low voltage transistor;

implanting the first type of dopant at a higher concentration than in the first implanting act to form second portions of the source and drain regions of the first low voltage transistor;

forming a metal layer over a surface of the substrate, followed by thermally treating the metal layer to selectively form a silicide layer over the second portions of the first low voltage transistor; and forming a first oxide layer on the substrate at the gate region of the first high voltage transistor and forming a second oxide layer on the first oxide layer and on the substrate at the gate region of the first low voltage transistor to form a combined oxide layer at the gate region of the first high voltage transistor that is thicker than the second oxide layer at the gate region of the first low voltage transistor.

14. An electronic device, comprising:

a semiconductor substrate;

a high voltage transistor integrated in the semiconductor substrate and having a gate region, a lightly-doped drain region, and dielectric spacer positioned immediately adjacent to the gate region and above a portion of the drain region, the drain region including a contact region that is laterally spaced from the spacer and is more heavily doped than the portion of the drain region under the spacer;

a low voltage transistor integrated in the semiconductor substrate and having source and drain regions each with a lightly-doped first portion and a heavily-doped second portion; and a silicide layer overlaying the second portions of the source and drain regions of the low voltage transistor.

15. The electronic device of claim 14 wherein the high voltage transistor also includes a lightly-doped source region which includes a highly-doped contact portion that, along with the contact region, is overlaid with a portion of the silicide layer.

16. The electronic device of claim 14 wherein the gate region of the high voltage transistor also includes a portion of the silicide layer.

17. A process for making in a semiconductor substrate an integrated structure that includes a first high voltage transistor and a first low voltage transistor, each having a corresponding gate region, the process comprising:

implanting a first type of dopant at a low concentration for forming drain and source regions of the first high voltage transistor and first portions of drain and source regions of the first low voltage transistor;

implanting the first type of dopant at a higher concentration than in the first implanting act to form second portions of the source and drain regions of the first low voltage transistor;

forming a metal layer over a surface of the substrate, followed by thermally treating the metal layer to selectively form a silicide layer over the second portions of the first low voltage transistor;

forming a second low voltage transistor and a second high voltage transistor in the semiconductor substrate;

forming a silicide layer on regions of said second low voltage transistor;

forming contact regions of the first high voltage transistor by selective implantation of the first type of dopant into a portion of said first high voltage transistor with the second high and low transistors being screened off; and forming contact regions of the second high voltage transistor by selective implantation of the second type of dopant into a portion of the second high voltage transistor, with the first high and low transistors being screened off.

* * * * *

UNITED STATES PATENT AND TRADEMARK OFFICE
CERTIFICATE OF CORRECTION

PATENT NO. : 6,268,633 B1　　　　　　　　　　　　　　　　　　Page 1 of 1
DATED : July 31, 2001
INVENTOR(S) : Federico Pio et al.

It is certified that error appears in the above-identified patent and that said Letters Patent is hereby corrected as shown below:

<u>Column 6, claim 10,</u>
Line 64, "making a semiconductor substrate" should read -- making in a semiconductor substrate --.

Signed and Sealed this

Fifteenth Day of January, 2002

Attest:

JAMES E. ROGAN
*Director of the United States Patent and Trademark Office*

*Attesting Officer*